(12) United States Patent
Das et al.

(10) Patent No.: US 9,854,357 B1
(45) Date of Patent: Dec. 26, 2017

(54) MINIMIZING STARTUP TRANSIENTS IN AN AUDIO PLAYBACK PATH

(71) Applicant: Cirrus Logic International Semiconductor Ltd., Edinburgh (GB)

(72) Inventors: Tejasvi Das, Austin, TX (US); Anand Ilango, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/195,626

(22) Filed: Jun. 28, 2016

(51) Int. Cl.
*H04R 3/00* (2006.01)
*H03F 3/20* (2006.01)
*H03F 3/181* (2006.01)

(52) U.S. Cl.
CPC ............. *H04R 3/007* (2013.01); *H03F 3/181* (2013.01); *H03F 3/20* (2013.01); *H03F 2200/03* (2013.01)

(58) Field of Classification Search
CPC . H04R 3/007; H03F 3/181; H03F 3/20; H03F 2200/03
See application file for complete search history.

(56) References Cited

U.S. PATENT DOCUMENTS

| | | | | |
|---|---|---|---|---|
| 5,796,851 A * | 8/1998 | Hewitt | ................... | H03G 3/348 381/120 |
| 6,600,365 B1 * | 7/2003 | Frith | ......................... | H03F 1/14 330/149 |
| 6,775,387 B1 * | 8/2004 | Mavencamp | ............. | H03F 1/14 381/104 |
| 7,092,534 B2 * | 8/2006 | Wang | ....................... | H03F 1/305 330/261 |
| 7,154,308 B2 * | 12/2006 | Ho | ............................ | H03F 1/02 327/108 |
| 7,254,244 B2 * | 8/2007 | Henson | ................... | H03F 1/305 330/149 |

(Continued)

OTHER PUBLICATIONS

Ginsberg, Mark, "Introduction 2 What Causes Pop in the TPA1517? Pop Reduction for the TPA1517 Audio Power Amplifier", Retrieved from the Internet: URL: http://www.ti.com/lit/an/sloa108/sloa108.pdf [retrieved on Feb. 6, 2017], figure 5, p. 4, line 1-p. 5, line 9.

(Continued)

*Primary Examiner* — Brenda Bernardi
(74) *Attorney, Agent, or Firm* — Jackson Walker L.L.P.

(57) ABSTRACT

A method may be provided for powering up or down a playback path comprising a digital-to-analog converter (DAC) for generating a non-ground-centered analog intermediate voltage centered at a common-mode voltage and coupled to a driver for generating a ground-centered playback path output voltage at an output of the driver wherein the output of the driver is clamped via a finite impedance to a ground voltage. The method may include transitioning continuously or in a plurality of discrete steps the analog intermediate voltage from an initial voltage to the common-mode voltage such that the transitioning is substantially inaudible at the output of the driver. A method for operating an output clamp of an output driver stage of a playback path may include transitioning continuously or in a plurality of discrete steps an impedance of the output clamp in order to match an output offset of the output driver stage in order to minimize audio artifacts appearing at an output of the output driver stage.

20 Claims, 2 Drawing Sheets

(56) References Cited

U.S. PATENT DOCUMENTS

| | | | | |
|---|---|---|---|---|
| 8,447,046 B2* | 5/2013 | Huang | ............... | H03F 1/305 |
| | | | | 330/10 |
| 8,901,999 B2* | 12/2014 | Araki | ............... | H03F 1/305 |
| | | | | 330/51 |
| 9,014,396 B2* | 4/2015 | Miao | ............... | H03F 1/305 |
| | | | | 330/284 |
| 9,020,165 B2* | 4/2015 | Viegas | ............... | H04B 15/00 |
| | | | | 381/94.5 |
| 9,225,293 B2* | 12/2015 | Teggatz | ............... | H03F 1/305 |
| 2004/0151329 A1* | 8/2004 | Judge | ............... | H03G 3/348 |
| | | | | 381/94.5 |
| 2005/0025322 A1 | 2/2005 | Henson et al. | | |
| 2005/0195991 A1 | 9/2005 | Wang et al. | | |
| 2006/0066363 A1 | 3/2006 | Ho | | |
| 2008/0144857 A1* | 6/2008 | Huang | ............... | H03F 1/305 |
| | | | | 381/94.5 |
| 2008/0204133 A1* | 8/2008 | Fontaine | ............... | H03F 1/305 |
| | | | | 330/69 |
| 2017/0063309 A1* | 3/2017 | Yadav | ............... | H03F 1/26 |

OTHER PUBLICATIONS

On Semiconductor: "AN-6044 Pop Suppression Techniques Using Analog Switches Introduction", Jun. 18, 2008, XP55342387, Retrieved from the Internet: URL: https://www.fairchildsemi.com/application-notes/AN/AN-6044.pdf [retrieved on Feb. 6, 2017], p. 3, lines 16-26.

International Search Report and Written Opinion of the International Searching Authority, International Patent Application No. PCT/2016/040458, dated Feb. 23, 2017.

* cited by examiner

MINIMIZING STARTUP TRANSIENTS IN AN AUDIO PLAYBACK PATH

FIELD OF DISCLOSURE

The present disclosure relates in general to circuits for audio devices, including without limitation personal audio devices such as wireless telephones and media players, and more specifically, to systems and methods for minimizing audible effects of electrical transients during powering on or startup of an audio playback pack.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

Using existing approaches, during startup of an audio playback path of a personal audio device, startup electrical transients of the audio playback path may lead to audible artifacts (e.g., pops or clicks) perceptible to a listener of the personal audio device.

SUMMARY

In accordance with the teachings of the present disclosure, one or more disadvantages and problems associated with existing audio signal paths may be reduced or eliminated.

In accordance with embodiments of the present disclosure, a method may be provided for powering up or down a playback path comprising a digital-to-analog converter (DAC) for generating a non-ground-centered analog intermediate voltage centered at a common-mode voltage and coupled to a driver for generating a ground-centered playback path output voltage at an output of the driver wherein the output of the driver is clamped via a finite impedance to a ground voltage. The method may include transitioning continuously or in a plurality of discrete steps the analog intermediate voltage from an initial voltage to the common-mode voltage such that the transitioning is substantially inaudible at the output of the driver.

In accordance with these and other embodiments of the present disclosure, a method for operating an output clamp of an output driver stage of a playback path may include transitioning continuously or in a plurality of discrete steps an impedance of the output clamp in order to match an output offset of the output driver stage in order to minimize audio artifacts appearing at an output of the output driver stage.

In accordance with these and other embodiments of the present disclosure, a playback path may include a digital-to-analog converter (DAC) for generating a non-ground-centered analog intermediate voltage centered at a common-mode voltage, a driver coupled to the DAC for generating a ground-centered playback path output voltage at an output of the driver, an output clamp for clamping the output of the driver to a ground voltage via a finite impedance, and circuitry configured to transition continuously or in a plurality of discrete steps the analog intermediate voltage from an initial voltage to the common-mode voltage such that the transition is substantially inaudible at the output of the driver.

In accordance with these and other embodiments of the present disclosure, a playback path may include a driver for generating a ground-centered playback path output voltage at an output of the driver, an output clamp for clamping the output of the driver to a ground voltage via a finite impedance, and a controller for operating the output clamp by, each time the output clamp is activated or deactivated, transitioning continuously or in a plurality of discrete steps an impedance of the output clamp in order to match an output offset of the driver in order to minimize audio artifacts appearing at an output of the driver.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
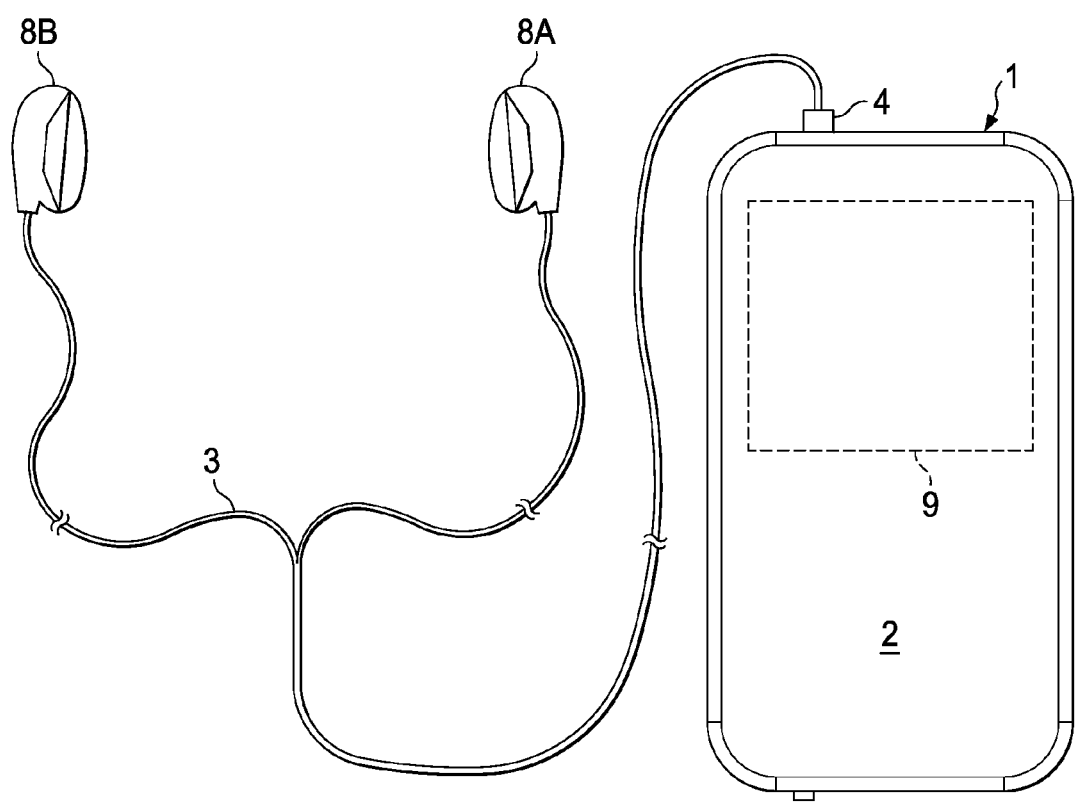
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
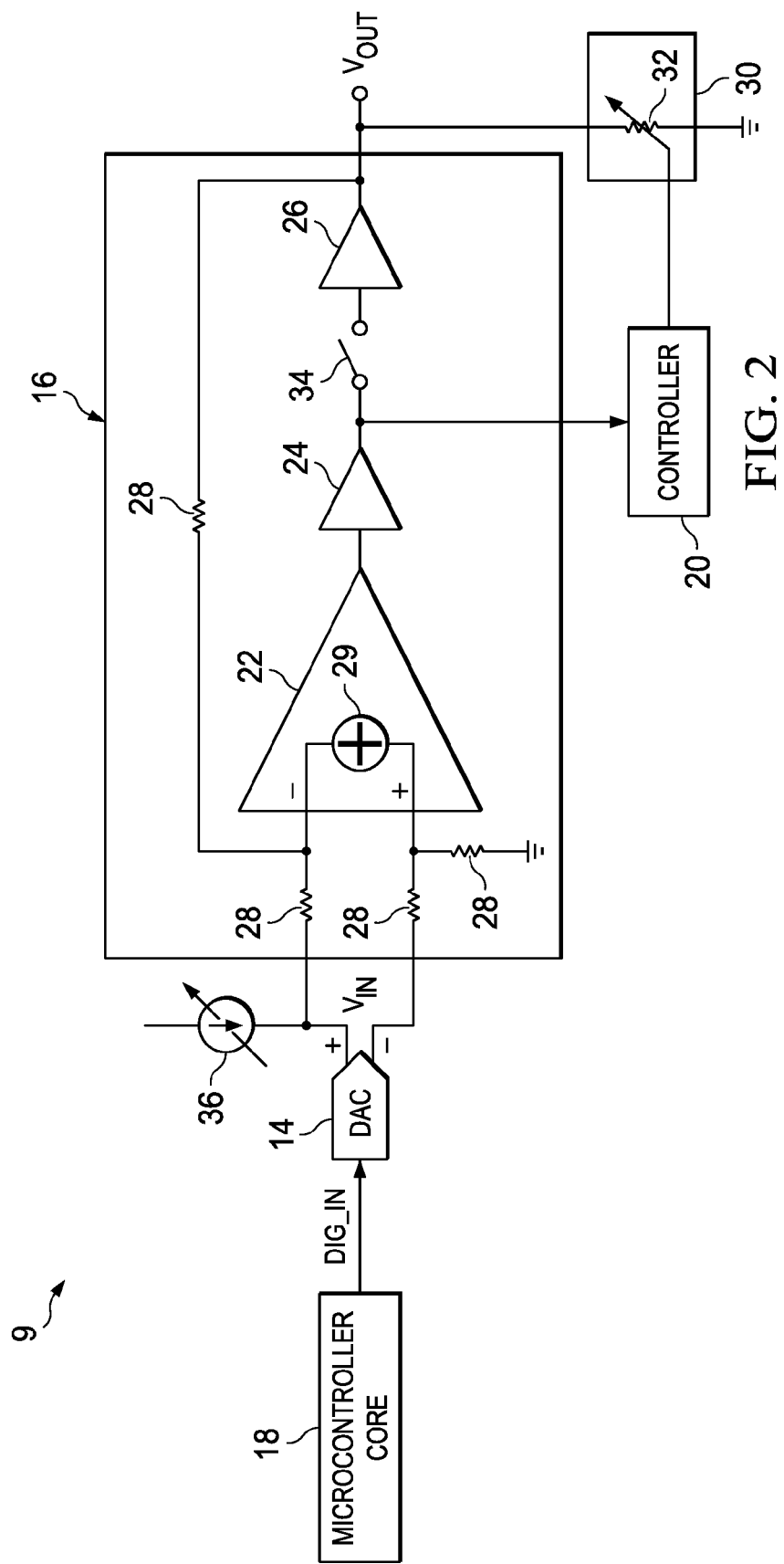
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an intermediate analog signal $V_{IN}$.

DAC 14 may supply intermediate analog signal $V_{IN}$ to an amplifier 16 which may amplify or attenuate audio input signal $V_{IN}$ in conformity with a gain to provide an audio output signal $V_{OUT}$, which may operate a speaker, headphone transducer, a line level signal output, and/or other suitable output. Amplifier 16 may comprise multiple amplifier stages 22, 24, and 26 coupled in succession with one another and a plurality of resistors 28 such that the gain of amplifier 16 is set by the resistances of resistors 28. As shown in FIG. 2, amplifier 16 may include, due to non-idealities of amplifier 16 (e.g., temperature variations, process tolerances, device mismatch, passive mismatch, etc.), a slight inherent offset 29 from a desired ground or common mode voltage associated with amplifier stage 16, which may affect signal output $V_{OUT}$. As also shown in FIG. 2, amplifier 16 may include a switch 34 coupled between amplifier stage 24 and amplifier stage 26. Such switch 34 may be deactivated (e.g., open, off, disabled, etc.) when the playback path implemented by audio IC 9 is powered down, and activated (e.g., closed, on, enabled, etc.) when the playback path is powered on. In some instances, amplifier 16 may also be referred to as a "driver."

FIG. 2 also depicts an output clamp 30 having a finite variable resistor 32 coupled between the output of amplifier 16 and ground. When the playback path implemented by audio IC 9 is powered down, a controller (e.g., controller 20) may cause variable resistor 32 to have a low impedance, such that audio output voltage $V_{OUT}$ is forced to approximately ground voltage. When the playback path implemented by audio IC 9 is powered on, a controller (e.g., controller 20) may cause variable resistor 32 to have a high impedance (ideally infinite), such that audio output voltage $V_{OUT}$ may be driven by amplifier 16. In some embodiments, variable resistor 32 may be implemented using a plurality of parallel switches each having a finite impedance, such that an impedance of variable resistor 32 is controlled by selectively activating and deactivating individual switches. Controller 20 may comprise any system, device, or apparatus for controlling clamp 30 and the resistance of variable resistor 32.

In operation, in order to reduce audio artifacts caused by electrical transients occurring at startup of the playback path implemented by audio IC 9, one or more components of audio IC 9 may cause analog intermediate voltage $V_{IN}$ to transition continuously or in a plurality of discrete steps from an initial voltage (e.g., ground voltage) to a common-mode voltage of DAC 14 such that the transition is substantially inaudible at the output of amplifier 16. When the analog intermediate voltage $V_{IN}$ is transitioned to any non-zero value, a level-shifting current may flow from the output of DAC 14 to the output node of amplifier 36 (e.g., via the network of resistors 28) and through clamp 30. If clamp 30 was an ideal clamp with zero impedance, such current would cause no change in voltage $V_{OUT}$ at the output node of amplifier 16. However, clamp 30, no matter how well constructed or engineered, may have a finite impedance associated with it and when the level-shifting current flows through such impedance, a voltage step in output voltage $V_{OUT}$ may be created at the output. However, in the present disclosure, analog intermediate voltage $V_{IN}$ may be transitioned in a manner in which a sequence of voltage steps created at the output node of amplifier are sufficient to minimize or eliminate audible artifacts. For example, in some embodiments, such transition may be performed by microcontroller core 18 or another component of audio IC 9 forcing digital input signal DIG_IN to DAC 14 to a maximum (e.g., maximum positive or maximum negative value) such that analog intermediate voltage $V_{IN}$ is initially set to the ground voltage when DAC 14 is powered on due to start-up of the playback path, and then microcontroller core 18 may transition digital input signal DIG_IN continuously or in a plurality of discrete steps such that analog intermediate voltage $V_{IN}$ transitions from the initial voltage (e.g., ground voltage) to the common-mode voltage such that the transitioning is substantially inaudible at the output of amplifier 16. In other embodiments, a variable current source 36 (or a plurality of current sources in parallel with each other and DAC 14) may be coupled to the output of DAC 14 and may be configured to increase the current output by such variable current source 36 continuously or in a plurality of discrete steps such that analog intermediate voltage $V_{IN}$ transitions from the initial voltage (e.g., ground voltage) to the common-mode voltage such that the transitioning is substantially inaudible at the output of amplifier 16.

In addition or alternatively, in operation, controller 20 may operate output clamp 30 by, each time the output clamp 30 is activated (e.g., impedance decreased to low impedance upon powering off of playback path) or deactivated (e.g., impedance decreased to low impedance upon powering on of playback path), transitioning continuously or in a plurality of discrete steps variable resistance 32 of output clamp 30 in order to match voltage offset 29 of amplifier 16 to the audio output signal $V_{OUT}$ in order to minimize audio artifacts appearing at the output of the amplifier 16. In some embodiments, one of stages 22 or 24 of amplifier 16 (shown in FIG. 2 as stage 24) may in effect be configured as a comparator to compare analog output signal $V_{OUT}$ to voltage offset 29. In other words, by sensing an output of one of the stages of amplifier 16 other than the final output stage 26, the output of such stage 22 or 24 may indicate whether transitioning of the impedance of output clamp 30 has caused audio output signal $V_{OUT}$ to reach a voltage approximately equal to voltage offset 29, and controller 20 may cease the transitioning upon occurrence of audio output signal $V_{OUT}$ reaching a voltage approximately equal to voltage offset 29. In these and other embodiments, controller 20 may be configured to transition variable resistance 32 of output clamp 30 in order to match voltage offset 29 of amplifier 16 to the audio output signal $V_{OUT}$ such that when output clamp 30 is activated or deactivated, audio output signal $V_{OUT}$ experiences no substantial change.

Although the various systems and methods described herein contemplate reduction of audio artifacts in audio paths of personal audio devices, the systems and methods herein may also apply to any other audio systems, including, without limitation, home audio systems, theaters, automotive audio systems, live performances, etc.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method for powering up or down a playback path comprising a digital-to-analog converter (DAC) for generating a non-ground-centered analog intermediate voltage centered at a common-mode voltage and coupled to a driver for generating a ground-centered playback path output voltage at an output of the driver, the method comprising:
   while the output of the driver is clamped via an output clamp having a finite impedance to a ground voltage, transitioning continuously or in a plurality of discrete steps the analog intermediate voltage from an initial voltage to the common-mode voltage such that the transitioning is substantially inaudible at the output of the driver.

2. The method of claim 1, further comprising:
   forcing an input signal of the DAC to a maximum such that the analog intermediate voltage is set to the ground voltage; and
   wherein transitioning comprises transitioning continuously or in a plurality of discrete steps the input signal such that the analog intermediate voltage transitions from an initial voltage to the common-mode voltage such that the transitioning is substantially inaudible at the output of the driver.

3. The method of claim 1, wherein transitioning comprises transitioning continuously or in a plurality of discrete steps the analog intermediate voltage from the ground voltage to the common-mode voltage such that the transitioning is substantially inaudible at the output of the driver.

4. The method of claim 1, further comprising operating the output clamp of the driver by, each time the output clamp is activated or deactivated, transitioning continuously or in a plurality of discrete steps an impedance of the output clamp in order to match an output offset of the driver in order to minimize audio artifacts appearing at the output of the driver.

5. The method of claim 4, wherein the output clamp impedance is matched to the output offset of the driver such that when the output clamp is activated or deactivated, no substantial change occurs in the playback path output voltage.

6. The method of claim 4, wherein the driver comprises a plurality of stages including an output stage for driving the output of the driver, and the method further comprises measuring the output offset by comparing, using one of the plurality of stages other than the output stage, the ground-centered playback path output voltage to an inherent voltage offset of the driver wherein the inherent voltage offset defines the output offset.

7. The method of claim 1, further comprising varying continuously or in a plurality of discrete steps an output offset of the driver to match the output offset of the driver to the playback path output voltage when an output clamp for clamping the output of the driver via the finite impedance to the ground voltage is activated in order to minimize audio artifacts appearing at an output of the driver during such varying, and such that when the output clamp is deactivated, the playback path output voltage is substantially unchanged.

8. A method for operating an output clamp of an output driver stage of a playback path comprising:
   transitioning continuously or in a plurality of discrete steps an impedance of the output clamp in order to match an output offset of the output driver stage in order to minimize audio artifacts appearing at an output of the output driver stage.

9. The method of claim 8, wherein the driver comprises a plurality of stages including an output stage for driving the output of the driver, the method further comprising measuring the output offset by comparing, using one of the plurality of stages other than the output stage, the clamped ground-centered analog output signal to an inherent voltage offset of the driver wherein the inherent voltage offset defines the output offset.

10. The method of claim 8, wherein the output clamp impedance is matched to the output offset of the driver such that when the output clamp is activated or deactivated, no substantial change occurs in the ground-centered playback path output voltage.

11. A playback path comprising:
   a digital-to-analog converter (DAC) configured to generate a non-ground-centered analog intermediate voltage centered at a common-mode voltage;
   a driver coupled to the DAC configured to generate a ground-centered playback path output voltage at an output of the driver;
   an output clamp configured to clamp the output of the driver to a ground voltage via a finite impedance; and
   circuitry configured to, while the output clamp is activated to clamp the output of the driver to the ground voltage, transition continuously or in a plurality of discrete steps the analog intermediate voltage from an initial voltage to the common-mode voltage such that the transition is substantially inaudible at the output of the driver.

12. The playback path of claim 11, wherein the circuitry is configured to:
   force an input signal of the DAC to a maximum such that the analog intermediate voltage is set to the ground voltage; and
   transition continuously or in a plurality of discrete steps the input signal such that the analog intermediate voltage transitions from an initial voltage to the common-mode voltage such that the transitioning is substantially inaudible at the output of the driver.

13. The playback path of claim 11, wherein the circuitry is configured to transition continuously or in a plurality of discrete steps the analog intermediate voltage from the ground voltage to the common-mode voltage such that the transitioning is substantially inaudible at the output of the driver.

14. The playback path of claim 11, further comprising a controller configured to operate the output clamp by, each time the output clamp is activated or deactivated, transitioning continuously or in a plurality of discrete steps an impedance of the output clamp in order to match an output offset of the driver in order to minimize audio artifacts appearing at the output of the driver.

15. The playback path of claim 14, wherein the controller is configured to transition the impedance to match to the output offset of the driver such that when the output clamp is activated or deactivated, the ground-centered playback path output voltage experiences no substantial change.

16. The playback path of claim 14, wherein the driver comprises a plurality of stages including an output stage configured to drive the output of the driver, and one of the plurality of stages other than the output stage is configured to compare the playback path output voltage to an inherent voltage offset of the driver wherein the inherent voltage offset defines the output offset.

17. The playback path of claim 11, further comprising a controller configured to continuously or in a plurality of discrete steps an output offset of the driver to match the output offset of the driver to the playback path output voltage when an output clamp configured to clamp the output of the driver via the finite impedance to the ground voltage is activated in order to minimize audio artifacts appearing at an output of the driver during such varying, and such that when the output clamp is deactivated, the ground-centered playback path output voltage is substantially unchanged.

18. A playback path comprising:
a driver configured to clamp a ground-centered playback path output voltage at an output of the driver;
an output clamp configured to clamp the output of the driver to a ground voltage via a finite impedance; and
a controller configured to operate the output clamp by, each time the output clamp is activated or deactivated, transitioning continuously or in a plurality of discrete steps an impedance of the output clamp in order to match an output offset of the driver in order to minimize audio artifacts appearing at an output of the driver.

19. The playback path of claim 18, wherein the controller is configured to transition the impedance to match to the output offset of the driver such that when the output clamp is activated or deactivated, the playback path output voltage experiences no substantial change.

20. The playback path of claim 18, wherein the driver comprises a plurality of stages including an output stage configured to drive the output of the driver, and one of the plurality of stages other than the output stage is configured to compare the playback path output voltage to an inherent voltage offset of the driver wherein the inherent voltage offset defines the output offset.

* * * * *